United States Patent
Izumi et al.

[11] Patent Number: 5,134,546
[45] Date of Patent: Jul. 28, 1992

[54] VEHICLE CONTROL UNIT STRUCTURE

[75] Inventors: Tomoji Izumi, Hatsukaichi; Yuichi Itoh; Nagahisa Fujita, both of Hiroshima, all of Japan

[73] Assignee: Mazda Motor Corporation, Hiroshima, Japan

[21] Appl. No.: 754,249

[22] Filed: Aug. 26, 1991

Related U.S. Application Data

[63] Continuation of Ser. No. 454,985, Dec. 22, 1989, abandoned.

[30] Foreign Application Priority Data

Dec. 23, 1988 [JP]  Japan .................. 63-323746

[51] Int. Cl.$^5$ .................. H05K 1/14; H05K 1/11; H05K 7/14
[52] U.S. Cl. .................. 361/395; 361/412; 361/415
[58] Field of Search .............. 361/386, 388, 389, 392, 361/394, 395, 398, 399, 412, 413, 415

[56] References Cited

U.S. PATENT DOCUMENTS

| | | |
|---|---|---|
| 3,699,394 | 10/1972 | Schuler . |
| 3,764,856 | 10/1973 | Martin . |
| 4,072,378 | 2/1978 | Lockbrunner et al. . |
| 4,177,499 | 12/1979 | Volkmann ............. 361/386 |
| 4,241,380 | 12/1980 | Lehmann et al. . |
| 4,409,641 | 10/1983 | Jakob et al. ............. 361/386 |
| 4,481,559 | 9/1984 | Buck et al. . |
| 4,571,663 | 2/1986 | McPherson . |
| 4,642,735 | 2/1987 | Hodsdon et al. ............ 361/399 X |
| 4,723,196 | 2/1988 | Hofmeister et al. . |
| 4,738,024 | 4/1988 | Eberhardt . |
| 4,808,115 | 2/1989 | Norton et al. ............. 361/395 |
| 4,823,233 | 4/1989 | Brown et al. ............. 361/415 X |
| 4,858,071 | 8/1989 | Manabe et al. ............. 361/386 |

FOREIGN PATENT DOCUMENTS

| | | |
|---|---|---|
| 1796753 | 6/1959 | Fed. Rep. of Germany . |
| 1947586 | 4/1971 | Fed. Rep. of Germany . |
| 7140652 | 1/1972 | Fed. Rep. of Germany . |
| 2552682A1 | 6/1977 | Fed. Rep. of Germany . |
| 2757282A1 | 7/1979 | Fed. Rep. of Germany . |
| 3630830A1 | 3/1988 | Fed. Rep. of Germany . |
| 3703088A1 | 8/1988 | Fed. Rep. of Germany . |
| 46-13234 | 4/1971 | Japan . |
| 63-16449 | 2/1988 | Japan . |
| 63-29947 | 2/1988 | Japan . |
| 63-131146 | 8/1988 | Japan . |
| 1307456 | 2/1973 | United Kingdom . |
| 1587998 | 4/1981 | United Kingdom . |
| 2122032 | 1/1984 | United Kingdom ............. 361/394 |

OTHER PUBLICATIONS

English Abstract of Japanese Patent Publication No. 46-13234—one page.

*Primary Examiner*—Leo P. Picard
*Assistant Examiner*—Michael W. Phillips

[57] ABSTRACT

In a vehicle control unit structure, a pair of first and second circuit boards in each of which conductive layers are adhered on a metal substrate through an insulating layer, and a circuit element is fixed to each of the conductive layers are arranged so that the conductive layers are connected to each other through a connecting substrate and are arranged to oppose each other. A third circuit board is located between the first and second circuit boards. The foregoing vehicle control unit structure is arranged into a closed case-like shape, thus preventing dust contamination and direct access by an operator and achieving a low cost, compact unit. A circuit element is mounted on the third circuit board.

19 Claims, 7 Drawing Sheets

VEHICLE CONTROL UNIT STRUCTURE

This is a continuation of co-pending application Ser. No. 07/454,985 filed on Dec. 22, 1989, now abandoned.

BACKGROUND OF THE INVENTION

The present invention relates to a vehicle control unit structure, which includes a pair of circuit boards in each of which conductive layers are adhered on a metal substrate through an insulating layer, and a circuit element is fixed to each conductive layer. More particularly, the invention is directed to a vehicle control unit structure, in which conductive layers are connected to each other through a connecting substrate, and are separated from each other to face each other.

Conventionally, a technique disclosed in Japanese Patent Publication No. 46-13234 is known for an integrated circuit having a pair of metal substrates, wherein conductive layers are adhered to each metal substrate through an insulating layer, a circuit element is fixed to each conductive layer, and the conductive layers are connected through a connecting substrate, and are separated from each other to face each other. A method of manufacturing the integrated circuit disclosed in this prior art comprises the step of anode-oxidizing at least one major surface of an aluminum substrate to form a thin aluminum oxide layer on the substrate surface, the step of selectively bonding and forming a resistive material and a high-conductivity material o the thin aluminum oxide film to form a plurality of circuit elements, the step fixing transistor pellets on lead portions formed by selectively bonding the high-conductivity material, and the step of sealing at least all the circuit elements.

In the integrated circuit formed in this manner, heat radiated from the resistors or transistors is quickly and effectively dissipated to allow formation of an integrated circuit of an output circuit or the like.

The integrated circuit formed in this manner may be employed in a vehicle in view of its compact structure and low cost. However, when the integrated circuit is actually used in a vehicle, the presence of a circuit element which cannot be mounted on the metal substrate poses a problem. In order to arrange the circuit element which cannot be mounted on the metal substrate while connecting it to the integrated circuit, the circuit element must be externally mounted. In this case, even if the integrated circuit is made compact, its merit cannot be sufficiently enjoyed.

SUMMARY OF THE INVENTION

The present invention has been made in consideration of the above situation, and has as its principal object to provide a vehicle control unit structure, which can achieve a compact structure and low cost, and can be equipped with a circuit element which cannot be directly mounted on a metal substrate without externally mounting it.

It is another object of the present invention to provide a vehicle control unit structure, which can achieve a compact structure and low cost, and can prevent circuit elements from being thermally damaged.

In order to achieve the principal object, a vehicle control unit structure according to the present invention comprises first and second circuit boards in each of which conductive layers are adhered on a metal substrate through an insulating layer, and a circuit element is fixed to each of the conductive layers, a connecting substrate for electrically connecting the conductive layers of the first and second circuit boards, support means for supporting the first and second circuit boards to be separated from each other so that the conductive layers oppose each other, and a third circuit board which is located between the first and second circuit boards, and on which a circuit element is mounted.

The vehicle control unit structure with the above arrangement comprises the third circuit board for the electrical parts, which is located between two metal substrates. In this manner, a circuit element which cannot be mounted on a metal substrate is mounted on the third circuit board, and can be equipped on the integrated circuit without being externally mounted.

In order to achieve the another object, a vehicle control unit structure according to the present invention comprises first and second circuit boards in each of which conductive layers are adhered on a metal substrate through an insulating layer, and a circuit element is fixed to each of the conductive layers, a connecting substrate for electrically connecting the conductive layers of the first and second circuit boards, support means for supporting the first and second circuit boards to be separated from each other so that the conductive layers oppose each other, and a heat shielding member, located between the first and second circuit boards, for shielding heat radiation between the first and second substrates.

The vehicle control unit structure with the above arrangement comprises the heat insulating member, located between two metal substrates, for insulating heat radiation between the two metal substrates. In this manner, even if a circuit element which is easily thermally damaged is mounted on one metal substrate, it can be reliably prevented from being thermally damaged by a circuit element which is mounted on the other metal substrate and radiates heat.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG .3B is a sectional view taken along a line B—B in FIG. 1.

DETAILED DESCRIPTION OF THE PREFERRED EMBODIMENTS

An embodiment of a vehicle control unit structure according to the present invention will be described in detail below with reference to FIGS. 1 to 8. This embodiment is applied to a case-like integrated circuit.

Figure 1:
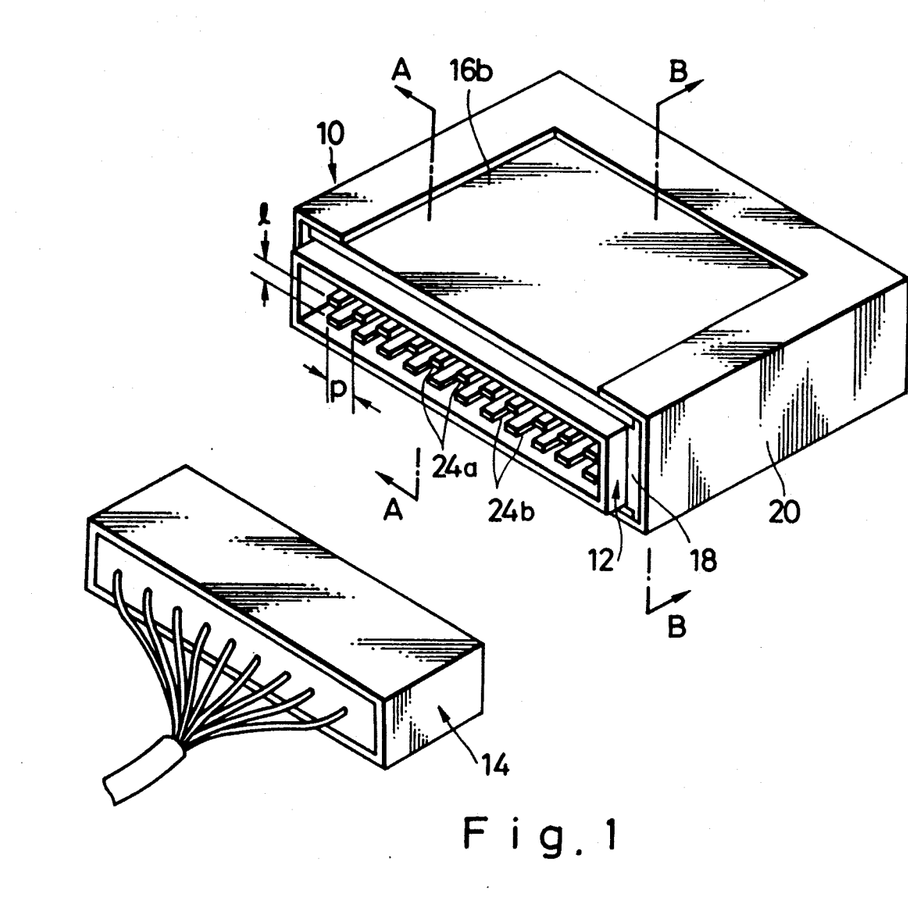
FIG. 1 is a perspective view showing an embodiment of a vehicle control unit structure according to the present invention, which is applied to an integrated circuit.

FIG. 1 shows an integrated circuit 10 of this embodiment. The integrated circuit 10 is arranged as a control unit, i.e., a vehicle functional component. More specifically, the integrated circuit 10 is arranged as an integrated circuit independently having a function of an engine control unit.

As shown in FIG. 1, the integrated circuit 10 is formed as a box-like case, whose interior is closed. A male connector 12 as a connecting device is integrally mounted on one end of the integrated circuit 10. The male connector 12 is connected to a conventional female connector 14, as will be described in detail below.

Figure 2:
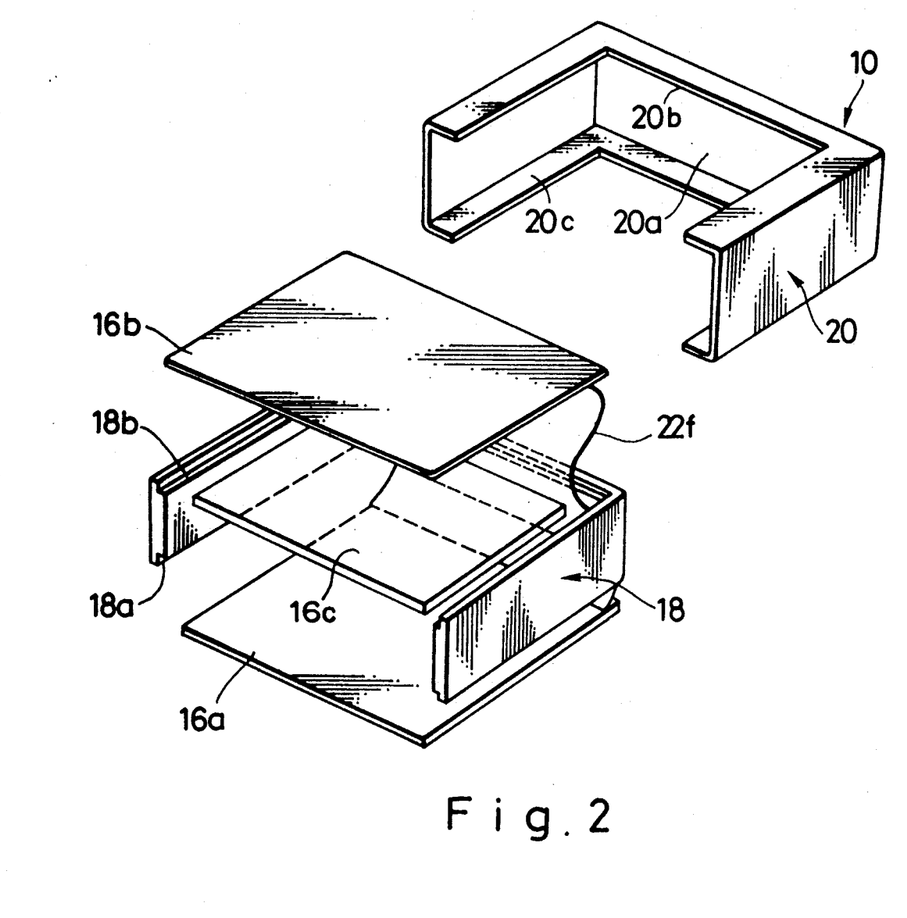
FIG. 2 is an exploded perspective view showing an arrangement of the integrated circuit shown in FIG. 1.
Figure 3A:
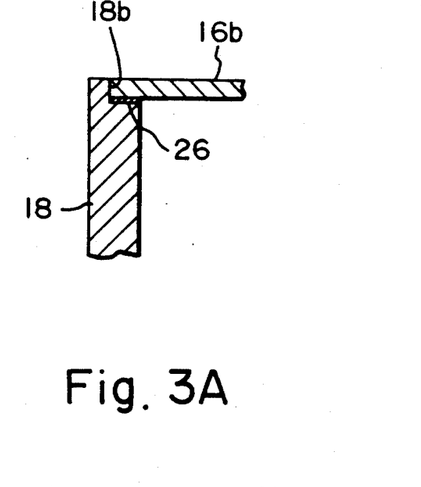
FIG. 3A is a sectional view taken along a line A—A in FIG. 1.
Figure 3B:
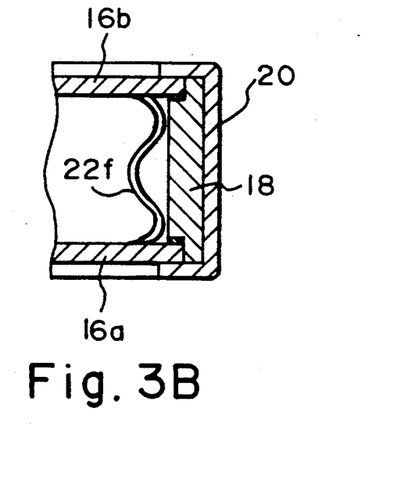

As shown in FIGS. 2 to 3B, the integrated circuit 10 comprises a pair of first and second circuit boards 16a and 16b which are vertically separated from each other, a third circuit board 16c located between the two circuit boards 16a and 16b, a side plate 18 for separating the first and second circuit boards 16a and 16b at a predetermined distance and closing the side surfaces, and a frame 20 for integrally fixing the first and second circuit boards 16a and 16b and the side plate 18.

Circuit elements; such as IC chips, resistors, capacitors, and the like; necessary for providing the function of the engine control unit are mounted on the first and second circuit boards 16a and 16b. More specifically, so-called logic circuit elements are connected to the lower first circuit board 16a, and so-called power circuit elements are connected to the upper second circuit board 16b.

Figure 4A:
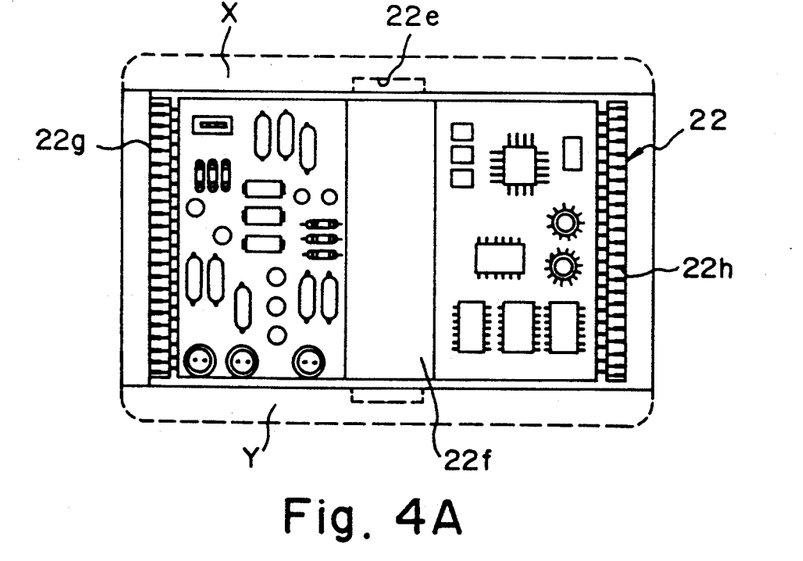
FIG. 4A is a plan view showing an arrangement of a common circuit board.
Figure 4B:
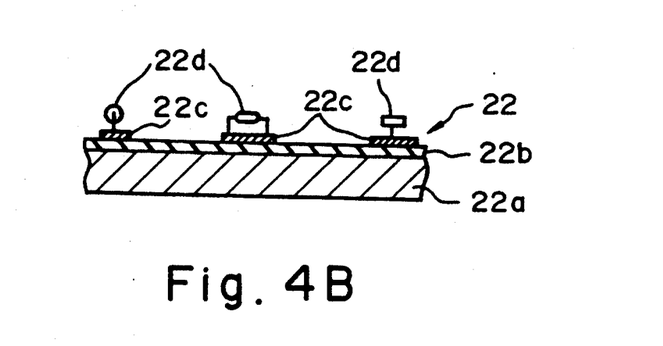
FIG. 4B is a sectional view showing the arrangement of the common circuit board.

As shown in FIG. 4A, the first and second circuit boards 16a and 16b are formed by splitting a single common circuit board 22. More specifically, as shown in FIG. 4B, the common circuit board 22 is formed by a circuit board body 22a formed of a conductive material such as aluminum, an insulating layer 22b adhered on the entire upper surface of the circuit board body 22a, conductive layers 22c formed on the insulating layer 22b to have a predetermined circuit pattern and to define a circuit network, and circuit elements 22d fixed on and electrically connected to the conductive layers 22c.

A vertically extending opening portion 22e is performed at the central portion of the common circuit board 22, as shown in FIG. 4A. The circuit networks on the left and right portions of the opening portion 22e are connected to each other through a flexible circuit board 22f arranged over the opening portion 22e. By cutting off upper and lower edges (regions indicated by reference symbols X and Y) including the upper and lower ends of the opening portion 22e, the pair of circuit boards 16a and 16b are formed.

In the common circuit board 22, a plurality of connecting terminals 22g and 22h are formed in lines along edges on the upper surfaces of portions corresponding to outer edge portions of the circuit boards 16a and 16b, i.e., on the opposing inner surfaces of the edge portions defining one end of the case in a state wherein the opposing circuit boards 16a and 16b are vertically separated from each other to face each other. Connecting pins 24a and 24b of the male connector 12 (to be described later) are fixed and electrically connected to these connecting terminals 22g and 22h to project outwardly.

The third circuit board 16c comprises a conventional circuit board body formed of a glass epoxy resin, and conductive layers which are adhered on both the upper and lower surfaces of the circuit board body, and are formed into a predetermined circuit pattern to define a circuit network. So-called semi-power circuit elements, which cannot be mounted on the first and 16a and 16b, are mounted on the third circuit board 16c.

Since the third circuit board 16c has the circuit board body formed of the glass epoxy resin, the third circuit board 16c itself serves as a heat insulating member. The third circuit board 16c can prevent heat radiated from circuit elements constituting the so-called power unit mounted on the upper second circuit board 16b from being transmitted to the circuit elements constituting the so-called logic unit mounted on the lower first circuit board 16a, and can effectively avoid these circuit elements from being thermally broken.

Figure 5:
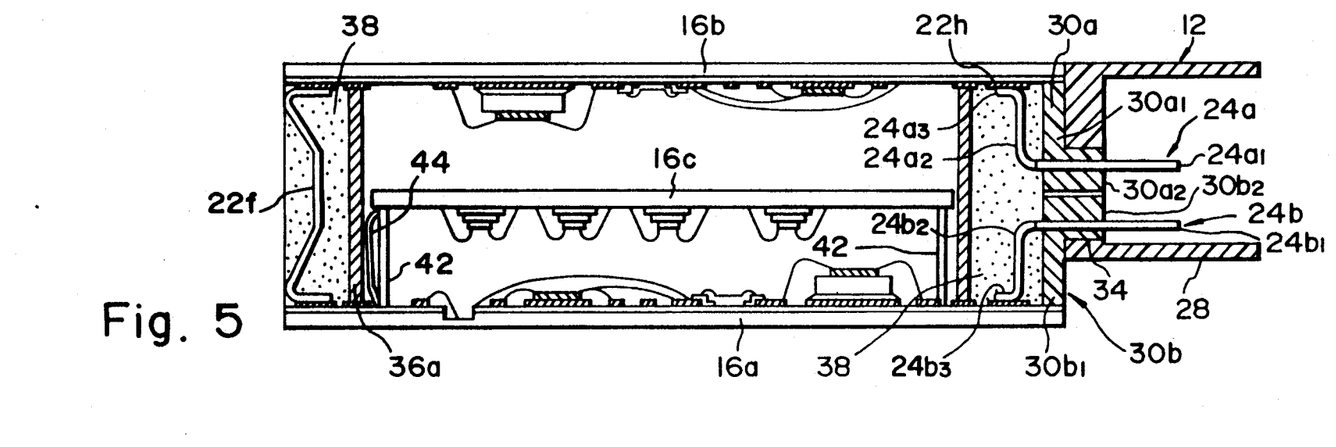
FIG. 5 is a sectional view showing an arrangement of a male connector mounted on the integrated circuit.
Figure 6:
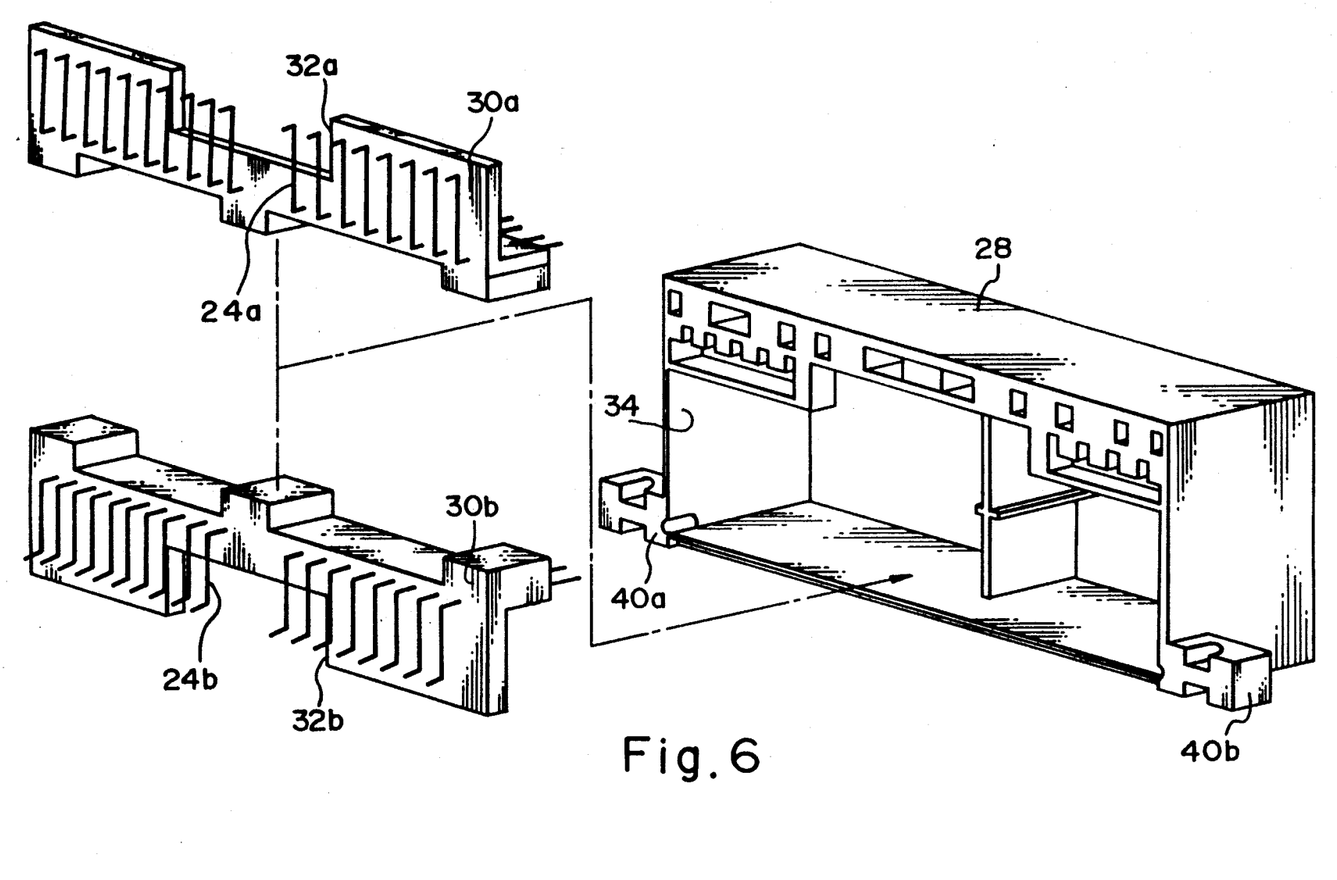
FIG. 6 is an exploded perspective view showing in detail the arrangement of the male connector.

As further shown in FIG. 5, the third circuit board 16c is supported above the first circuit board 16a through a plurality of support posts 42 to be lifted upward by a predetermined distance. The third circuit board 16c is electrically connected to the first circuit board 16a through a sub flexible circuit board 44.

The side plate 18 described above is formed to have a U-shaped shape having one open side when viewed from the above. The open side portion serves as one end of the case. Stepped portions 18a and 18b for receiving three edge portions of each of the circuit boards 16a and 16b are formed at inner side edges of the upper and lower end faces of the side plate 18.

As shown in FIG. 3A, the circuit boards 16a and 16b are fitted in the corresponding stepped portions 18a and 18b through rubber seal members 26. Since the rubber seal members 26 are inserted, dust or the like can be prevented from entering the case from gaps between the circuit boards and the stepped portions.

The frame 20 is formed to surround the side surfaces closed by the side plate 18 while vertically clamping it, as shown in FIG. 2. More specifically, 10 the frame 20 consists of an integral body of a main body 20a opposing the side plate 18, and flange portions 20b and 20c extending inwardly from the upper and lower ends of the main body 20 by a predetermined distance (more specifically, by a distance large enough to clamp three non-open edge portions of the circuit boards 16a and 16b).

As shown in FIG. 3B, the frame 20 vertically clamps the upper and lower second and first circuit boards 16b and 16a respectively fitted in the upper and lower stepped portions 18b and 18a of the side plate 18, thereby integrally constituting the case. As shown in FIG. 3B, the flexible circuit board 22f for connecting circuit elements 22d of the upper and lower second and first circuit boards 16b and 16a is located slightly inwardly from the other end portion of the side plate 18.

Since the frame 20 is formed in this manner, the first and second circuit boards 16a and 16b can maintain an assembled state while being vertically separated at a predetermined distance in a state wherein the side plate 18 is interposed therebetween.

In this embodiment, the integrated circuit 10 is formed into a case-like shape, and the upper and lower surfaces of the case are directly defined by the circuit boards 16b and 16a. As a result, a compact, light-weight structure can be realized as compared to a case wherein the first and second circuit boards 16a and 16b are housed in a separate case. The third circuit board 16c is disposed between the first and second circuit boards 16a and 16b, and circuit elements which cannot be mounted on the first and second circuit boards 16a and 16b are mounted on the third circuit board 16c. In this manner, all the circuit elements can be mounted on the integrated circuit 10 without being externally mounted.

The arrangement of the connecting device for connecting the case-like integrated circuit 10 with the above arrangement to portions to be controlled of the vehicle will be described below with reference to FIGS. 5 to 8.

The connecting device comprises the male connector 12 mounted on one opening portion of the case-like integrated circuit 10 in a so-called internal mounting state, and the female connector 14 detachably connected to the male connector 12. As shown in FIG. 5, the male connector 12 has a so-called 3-piece structure, i.e., comprises a connector housing 28 formed into a box-like housing having open front and rear surfaces, an upper connecting pin support member 30a on which the upper connecting pins 24a are disposed to be laterally aligned in line, and a lower connecting pin support member 30b on which the lower connecting pins 24b are disposed to be laterally aligned in line.

The upper and lower connecting pin support members 30a and 30b are formed vertically symmetrically about the vertically central portion. The upper connecting pin support member 30a is integrally formed into a substantially L shape by an upright segment $30a_1$, and a projection $30a_2$ projecting outwardly from the lower end of the upright segment $30a_1$. The lower connecting pin support member 30b is integrally formed into a substantially inverted-L shape by an upright segment $30b_1$, and a projection $30b_2$ projecting outwardly from the upper end of the upright segment $30b_1$.

Each upper connecting pin 24a is integrally formed by a horizontal portion $24a_1$ which horizontally extends through the projection $30a_2$ to project in the back-and-forth direction, a vertical portion $24a_2$ which extends vertically upward from the inner edge of the horizontal portion $24a_1$ along the inner surface of the upright segment $30a_1$, and a bent portion $24a_3$ which is inwardly bent from the upper end of the vertical portion $24a_2$. The bent portion $24a_3$ is defined as a connecting portion connected to the corresponding connecting terminal 22h formed on the upper second circuit board 16b by soldering. The outward projecting portion of the horizontal portion $24a_1$ is defined as a connecting portion inserted in and connected to the female connector 14.

Each lower connecting pin 24b is integrally formed by a horizontal portion $24b_1$ which horizontally extends through the projection $30b_2$ to project in the back-and-forth direction, a vertical portion $24b_2$ which extends vertically downward from the inner edge of the horizontal portion $24b_1$ along the inner surface of the upright segment $30b_1$, and a bent portion $24b_3$ which is inwardly bent from the lower end of the vertical portion $24b_2$ The bent portion $24b_3$ is defined as a connecting portion connected to the corresponding connecting terminal 22g formed on the lower first circuit board 16a by soldering. The outward projecting portion of the horizontal portion $24b_1$ is defined as a connecting portion inserted in and connected to the female connector 14.

The connecting pin support members 30a and 30b have sizes large enough to be just fitted in the one-end opening portion of the case-like integrated circuit 10 in a state wherein they are coupled vertically. In other words, a range of the two upright segments $30a_1$ and $30b_1$ (i.e., an outer periphery) of the vertically coupled support members 30a and 30b just defines the inner periphery of the one-end portion of the integrated circuit 10.

Recesses 32a and 32b are respectively formed at the central portions of the upper and lower edges of the connecting pin support members 30a and 30b. These recesses 32a and 32b define an injection hole of an epoxy resin which is injected after the male connector 12 is integrally assembled with the integrated circuit 10, as will be described later.

The upper and lower connecting pins 24a and 24b have vertically symmetrical shapes, i.e., have the same shape, and the upper and lower connecting pin support members 30a and 30b also have the vertically symmetrical shapes, i.e., the same shape. In this manner, since the connecting pin support members 30a and 30b on which the connecting pins 24a and 24b are mounted have the same shape, components can be commonly used, thus reducing cost.

Figure 7:
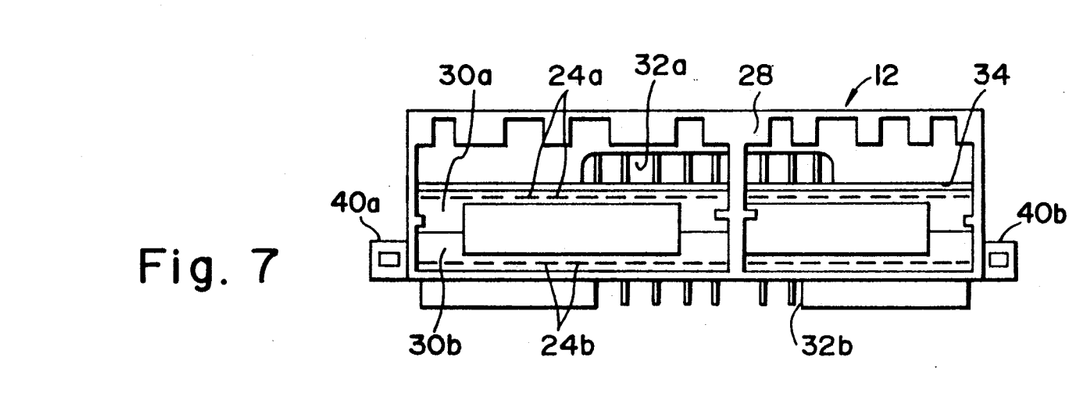
FIG. 7 is a front view showing an assembled state of the male connector.

The connector housing 28 described above has a fitting hole 34 which extends in the back-and-fort direction. The fitting hole 34 has a size large enough to receive the stacked projections $30a_2$ and $30b_2$ while the upper and lower connecting pin support members 30a and 30b are coupled, as shown in FIG. 7.

Mounting flanges 40a and 40b are formed integrally on two side portions of the connector housing 28. These flange portions 40a and 40b are fixed to a vehicle body (not shown) after the male connector 12 is mounted on and fixed to the integrated circuit 10. In this manner, a flange portion for mounting the integrated circuit 10 need not be provided to the integrated circuit 10 itself, resulting in the simple integrated circuit 10.

In this embodiment, and so noted in FIG. 1 a vertical interval l and a horizontal pitch p of the connecting pins 24a and 24b are defined on the basis of the conventional pin alignment specifications. As a result, the female connector 14 connected to the male connector 12 can employ a conventional one, thus providing economic advantages.

A conventional male connector is not employed since it is heavy and large in size. Instead, the special male connector 12 is formed in correspondence with the compact, light-weight case-like integrated circuit 10. Therefore, according to this embodiment, the compact, light-weight structure of the integrated circuit 10 can be assured.

Figure 8:
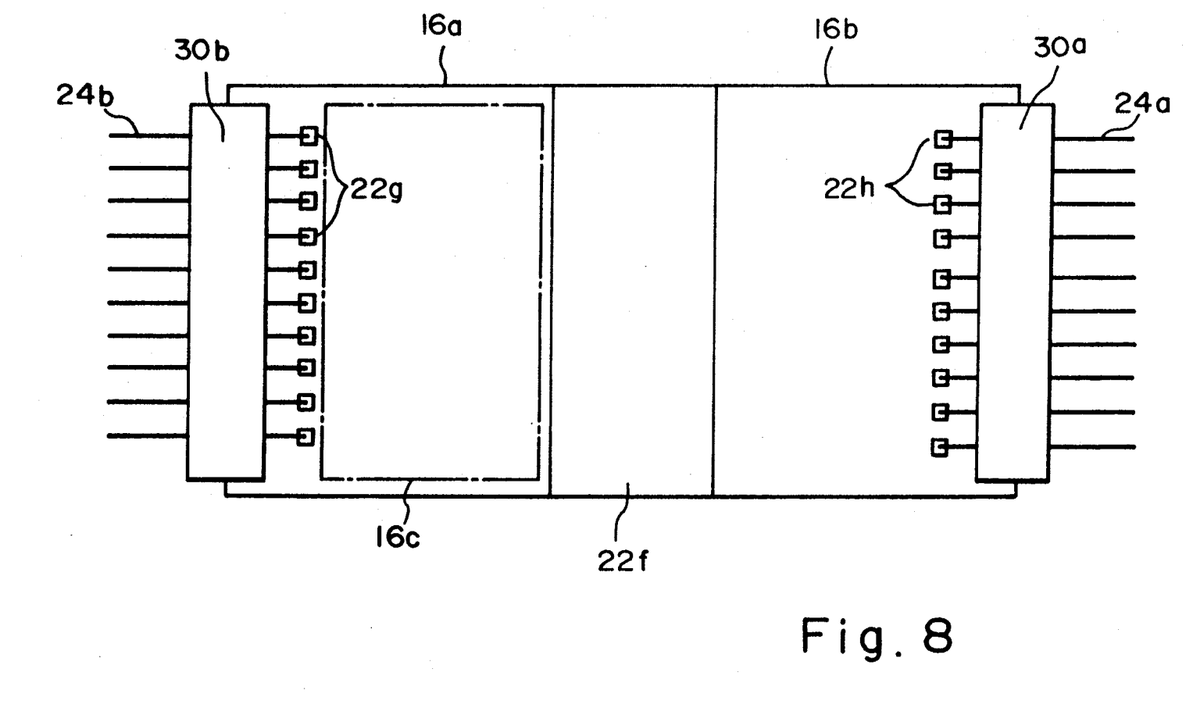
FIG. 8 is a top view showing a state wherein two connecting pin support members are fixed to open circuit boards.

An assembly operation of the male connector 12 whose assembled state is shown in FIG. 5, and an assembly operation of the integrated circuit 10 will be described below with reference to FIG. 8.

As has been described above with reference to FIGS. 4A and 4B, the upper and lower edges X and Y are cut from the common circuit board 22 on which the predetermined circuit elements 22d are mounted, so that the first and second circuit boards 16a and 16b are formed in an open state on the same plane. As shown in FIG. 5, the third circuit board 16c is mounted on the first and second circuit boards 16a and 16b in the open state through the support posts 42, the third circuit board 16c and the first circuit board 16a are electrically connected to each other through the sub flexible circuit board 44, and the corresponding pin support members 30a and 30b are fixed to each other by an adhesive.

As described above, the corresponding connecting pins 24a and 24b have already been mounted on these connecting pins support members 30a and 30b. In this manner, these connecting pins 24a and 24b are soldered to the corresponding connecting terminals 22g and 22h of the first and second circuit boards 16a and 16b in the open state. In particular, a precise soldering operation is required since the number of connecting terminals 22g and 22h is large. In this embodiment, however, since the first and second circuit boards 16a and 16b are set in the open state on the same plane, the soldering operation can be reliably executed, thus improving workability and assuring easy assembly.

Thereafter, the second circuit board 16b is lifted while the first circuit board 16a is held in position, and is moved to a position above and parallel to the lower first circuit board 16a. As shown in FIG. 8, the connecting pin support members 30a and 30b are then coupled vertically. When the connecting pin support members 30a and 30b are vertically coupled in this manner, the first and second circuit boards 16a and 16b are held to be parallel to each other.

Prior to the coupling operation, frame members 36a and 36b for keeping a predetermined interval between the first and second circuit boards 16a and 16b, and shielding an internal space from the outside while reinforcing the mechanical strength of the integrated circuit 10 are mounted in an upright state on the front and rear portions of the lower first circuit board 16a, as shown in FIG. 5. One frame member 36a is located slightly inwardly from the flexible circuit board 22f and slightly outwardly from the third circuit board 16c. The other frame member 36b is located slightly inwardly from the connecting terminals 22g and 22h and slightly outwardly from the third circuit board 16c.

The assembly is fitted in the fitting hole 34 of the connector housing 28 while maintaining the coupled state of the members 30a and 30b. In the fitting state, the male connector 12 is integrally mounted on the integrated circuit 10. Thereafter, as described above, the side plate 18 is attached to the integrated circuit 10, and the frame 20 is fitted thereon, thereby forming the integrated circuit 10 shown in FIG. 1, which integrally comprises the male connector 12.

After the assembly, an epoxy resin 38 is injected to a portion between the male connector 12 and the frame member 36b through the hole defined by the recesses 32a and 32b so as to securely adhere the assembled male connector 12 to the integrated circuit 10 and to satisfactorily fix the soldering portions between the connecting pins 24a and 24b and the corresponding connecting terminals 22g and 22h while perfectly shielding the interior of the integrated circuit 10. Thus, the portion between the male connector 12 and the frame member 36b is filled with the epoxy resin 38.

A portion in front of the frame member 36a is filled with the epoxy resin 38 to protect the flexible circuit board 22f and to shield the interior of the integrated circuit 10.

As described above, in the integrated circuit 10 of this embodiment, the third circuit board 16c is disposed between the first and second circuit boards 16a and 16b, and the circuit elements which cannot be mounted on the first and second circuit boards 16a and are mounted on the third circuit board 16c. In this manner, all the circuit elements can be mounted on the integrated circuit 10 without being externally mounted.

In this embodiment, the male connector 12 is constituted by the connector housing 28 and the vertically split connecting pin support members 30a and 30b. Thus, prior to assembly of the integrated circuit 10, the connecting pin support members 30a and 30b are respectively fixed to the corresponding circuit boards 16a and 16b, and the connecting pins 24a and 24b are connected to the corresponding connecting terminals 22g and 22h. In this manner, easy assembly of the integrated circuit 10 can be assured.

In the above embodiment, the upper and lower surfaces of the integrated circuit 10 to which the male connector 12 is fixed are defined by the pair of circuit boards 16b and 16a. As a result, according to this embodiment, the number of components of the integrated circuit 10 can be reduced, resulting in a compact, low-cost structure.

In this embodiment, each of the circuit boards 16a and 16b comprises the conductive circuit board body 22a formed of aluminum, the insulating layer 22b adhered on the circuit body 22a, and the conductive layers 22c adhered on the insulating layer 22b in a predetermined circuit pattern. As a result, heat radiated from the various circuit elements 22d can be dissipated by utilizing the aluminum circuit board body 22a as a heat dissipation plate. Therefore, another heat dissipation member need not be arranged, thus greatly reducing the size of the structure.

In this embodiment, since the upper and lower surfaces of the case are respectively defined by the pair of circuit boards 16b and 16a each having the aluminum circuit board body 22a, these circuit boards 16a and 16b can be utilized as electromagnetic shield members. As a result, the internal space of the integrated circuit 10 on this case is substantially electromagnetically shielded, and the circuit elements 22d do not easily suffer from adverse influences of electromagnetic waves The present invention is not limited to the arrangement of the embodiment described above, and various changes and modifications may be made within the spirit and scope of the invention.

In the above embodiment, the integrated circuit 10 having the function of the engine control unit has been exemplified. However, the present invention is not limited to this. For example, the integrated circuit 10 may serve as a functional component, e.g., an automatic vehicle velocity controller, a four-wheel steering controller, an automatic transmission controller or the like.

In the above embodiment, the male connector 12 is fixed to the integrated circuit 10 in a so-called internal mounting state. However, the present invention is not limited to this arrangement. For example, the male connector 12 may be externally fixed to the integrated circuit 10.

In the above embodiment, arrays of the connecting terminals 22g and 22h are formed on the circuit boards 16a and 16b in correspondence with the upper and lower arrays of connecting pins 24a and 24b. However, the present invention is not limited to this arrangement. For example, if a large number of connecting pins 24a and 24b are arranged, the connecting terminals 22g and 22h may be aligned each in two lines.

Figure 9:
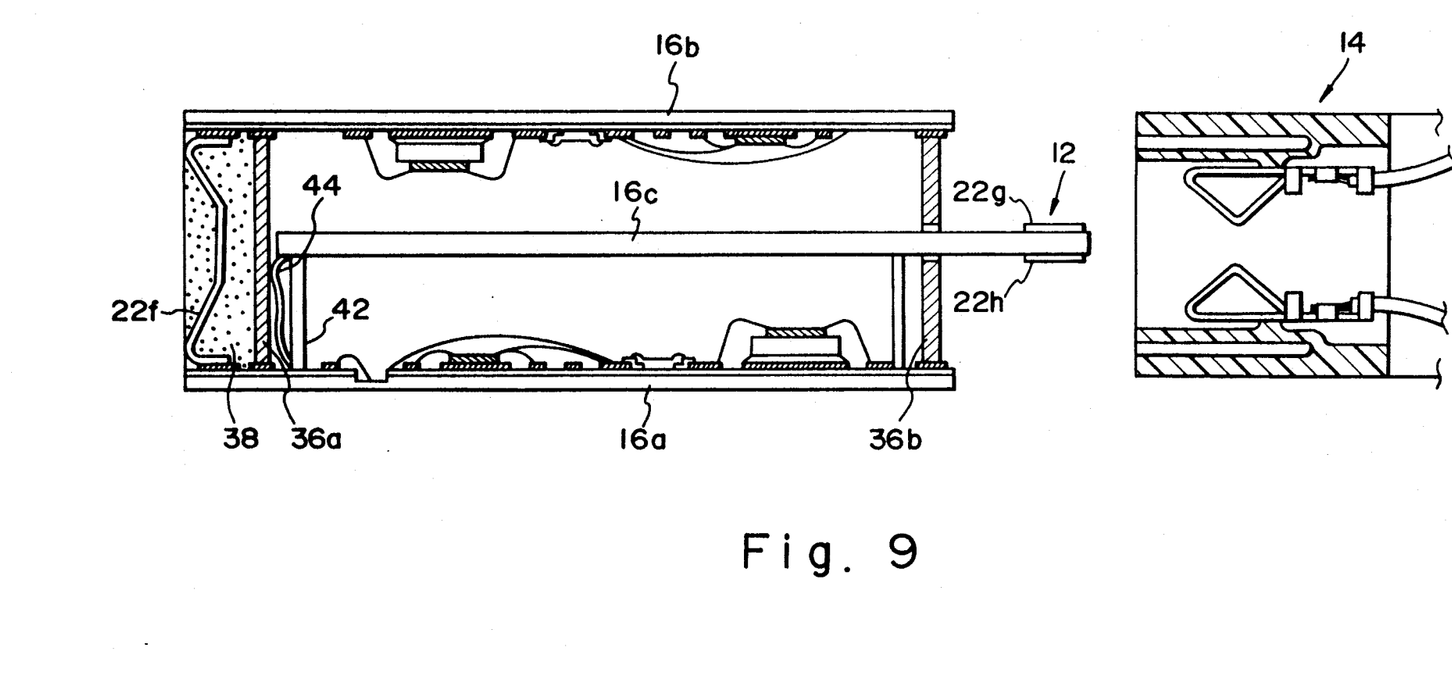
FIG. 9 is a side sectional view showing an arrangement of another embodiment of a vehicle control unit structure according to the present invention.

In the above embodiment, the male connector 12 is attached to the integrated circuit 10. However, the present invention is not limited to this arrangement. For example, as shown in FIG. 9 as another embodiment of the present invention, one-end portion of the third circuit board 16c may be used as a connector housing.

Another embodiment of the present invention will now be described in detail with reference to FIG. 9. In the following description, the same reference numerals denote the same parts as in the above embodiment, and a detailed description thereof will be omitted.

In this embodiment, the one-end portion (end portion on the side of an opening) of the third circuit board 16c projects outwardly from the first and second circuit boards 16a and 16b. The connecting terminals 22g and 22h are formed on the one-end portion of the third circuit board 16c, and no connecting terminals are formed on the one-end portions of the first and second circuit boards 16a and 16b. The frame member 36b described above is mounted to close the one-end opening portion defined by the first and second circuit boards 16a and 16b.

In this embodiment, the projecting portion at the one-end portion of the third circuit board 16c serves as a connector housing of the male connector 12, and the connecting terminals 22g and 22h serve as connecting pins. As a result, in this embodiment, the male connector 12 is integrally formed on the integrated circuit 10.

Since the male connector 12 is defined in this manner, the female connector 14 connected to the male connector 12, which comprises vertically separated connecting terminals 14a and 14b, as shown in FIG. 9, is employed.

According to this embodiment, the same operations and effects as in the embodiment described above can be provided.

As described above, the vehicle control unit structure according to the present invention in which circuit boards in each of which conductive layers are adhered on a metal substrate through an insulating layer and a circuit element is fixed to each conductive layer are arranged so that their conductive layers oppose each other after the conductive layers are connected through a connecting substrate, is characterized by comprising a third circuit board for electrical components, which is located between the two metal substrates.

Therefore, according to the present invention, there can be provided a vehicle control unit structure which can realize a compact, low-cost structure, and can be equipped with a circuit element which cannot be mounted on a metal substrate without externally mounting it.

The vehicle control unit structure according to the present invention in which circuit boards in each of which conductive layers are adhered on a metal substrate through an insulating layer and a circuit element is fixed to each conductive layer are arranged so that their conductive layers oppose each other after the conductive layers are connected through a connecting substrate, is characterized by comprising a shielding member, located between the two metal substrates, for shielding heat radiation between the two metal substrates.

Therefore, according to the present invention, there can be provided a vehicle control unit structure which can realize a compact, low-cost structure, and can prevent circuit elements from being thermally damaged.

As many apparently widely different embodiments of the present invention can be made without departing from the spirit and scope thereof, it is to be understood that the invention is not limited to the specific embodiments thereof except as defined in the appended claims.

What is claimed is:
1. A vehicle control unit structure comprising:
(a) first and second circuit boards in each of which a conductive layer is adhered on an insulating over a metal substrate, and at least one circuit element is fixed to each said conductive layer;
(b) a connecting substrate electrically connecting said conductive layers on said first and second circuit boards;
(c) a support member supporting said first and second circuit boards and separating the first and second circuit boards from each other with said conductive layers opposing each other, said support member including supporting side plates (i) having stepped portions mating with said first and second circuit boards and (ii) forming segments of a closed case with said first and second circuit boards, the side plates forming three sides of the case, the first and second circuit boards forming the top and bottom of the case, and wherein an opening is formed as a fourth side of the case for receiving a connector member therein; and
(d) a third circuit board, located in said case between said first and second circuit boards, and on which a circuit element is mounted.

2. The structure according to claim 1, wherein said side plates are formed as an integral U-shaped plate having one open side.

3. The structure according to claim 1, wherein said third circuit board is electrically connected to said first circuit board and/or said second circuit board through a second connecting substrate.

4. The structure according to claim 1, wherein said third circuit board is mounted on one of said first and second circuit boards through a plurality of support posts to be separated from said first and second circuit boards.

5. The structure according to claim 1,
further comprising a wrap around frame for fixing the side plates to the first and second circuit boards.

6. The structure according to claim 5,
further comprising a seal provided at the mating between the side plates and the first and second circuit boards.

7. A vehicle control unit structure comprising:
(a) first and second circuit boards in each of which a conductive layer is adhered on an insulating layer over a metal substrate, and at least one circuit element is fixed to each said conductive layer;
(b) a connecting substrate electrically connecting said conductive layers of said first and second circuit boards;
(c) a support member supporting said first and second circuit boards and separating the first and second circuit boards from each other with said conductive layers opposing each other, said support member including supporting side plates (i) having stepped portions mating with said first and second circuit boards and (ii) forming segments of a closed case with said first and second circuit boards, the side plates forming three sides of the case, the first and second circuit boards forming the top and bottom of the case, and wherein an opening is formed as a fourth side of the case for receiving a connected member therein; and
(d) a heat shielding member, located in said case between said first and second circuit boards, for shielding heat radiation between said first and second substrates.

8. The structure according to claim 7, wherein
said first circuit board is arranged on a lower side of said support means,
said second circuit board is arranged on a upper side of said support means,
high-power circuit elements are mounted on said second circuit board, and
low-power circuit elements are mounted on said first circuit board.

9. The structure according to claim 7, wherein said heat shielding member comprises a third circuit board formed of a glass epoxy resin.

10. The structure according to claim 9, wherein one end of said heat shielding member extends outwardly from a space surrounded by said first and second circuit boards.

11. The structure according to claim 10, wherein said heat shielding member is electrically connected to said first circuit board and/or said second circuit board through a second connecting substrate.

12. The structure according to claim 11, wherein connecting terminals electrically connected to connector means for connecting said control unit structure to an external circuit are disposed on a projecting end portion of said heat shielding member.

13. The structure according to claim 9, wherein said third circuit board has at least one circuit element thereof which is not suitable for physical or operational mounting on the metal substrates of said first and second circuit boards.

14. The structure according to claim 9, wherein a portion of said third circuit board extends from the fourth side of said case to the exterior, and
connecting terminals are provided on the extended portion of said third circuit board.

15. The structure according to claim 7, wherein said heat shielding member comprises a third circuit board formed of a glass epoxy resin, and a circuit element is mounted on said third circuit board.

16. The structure according to claim 15, wherein said third circuit board is electrically connected to said first circuit board and/or said second circuit board through a second connecting substrate.

17. The structure according to claim 7,
further comprising a wrap around frame for fixing the side plates to the first and second circuit boards.

18. The structure according to claim 17,
further comprising a seal provided at the mating between the side plates and the first and second circuit boards.

19. The structure according to claim 7, wherein said side plates are formed as an integral U-shaped side plate having one open side.

* * * * *

UNITED STATES PATENT AND TRADEMARK OFFICE
CERTIFICATE OF CORRECTION

PATENT NO. : 5,134,546
DATED : July 28, 1992
INVENTOR(S) : TOMOJI IZUMI ET AL.

It is certified that error appears in the above-identified patent and that said Letters Patent is hereby corrected as shown below:

Col. 1, line 30, "o" s/b --on--.

Col. 4, line 12, "first and 16a" s/b --first and second circuit boards 16a--;
line 45, "10 the frame 20" s/b --the frame 20--.

Col. 6, line 42, "so" s/b --as--;
line 43, "1" s/b --$\lambda$--.

Col. 7, line 9, "22g and 22b" s/b --22g and 22h--;
line 68, "16a and are" s/b --16a and 16b are--.

Col. 8, line 40, "waves" s/b --waves.--.

Col. 10, line 28 (claim 2), "U-shaped plate" s/b --U-shaped side plate--.

Col. 11, line 6 (claim 8), "a upper" s/b --an upper--.

Signed and Sealed this

Twelfth Day of October, 1993

Attest:

BRUCE LEHMAN

Attesting Officer

Commissioner of Patents and Trademarks